US008212555B2

(12) United States Patent
Sugiura

(10) Patent No.: US 8,212,555 B2
(45) Date of Patent: Jul. 3, 2012

(54) MAGNETIC SENSOR CIRCUIT

(75) Inventor: Masakazu Sugiura, Chiba (JP)

(73) Assignee: Seiko Instruments Inc., Chiba (JP)

( * ) Notice: Subject to any disclaimer, the term of this patent is extended or adjusted under 35 U.S.C. 154(b) by 474 days.

(21) Appl. No.: 12/596,374

(22) PCT Filed: Mar. 13, 2008

(86) PCT No.: PCT/JP2008/054544
§ 371 (c)(1),
(2), (4) Date: Oct. 16, 2009

(87) PCT Pub. No.: WO2009/025096
PCT Pub. Date: Feb. 26, 2009

(65) Prior Publication Data
US 2010/0127700 A1    May 27, 2010

(30) Foreign Application Priority Data
Aug. 21, 2007   (JP) .................................. 2007-214737

(51) Int. Cl.
*G01R 33/06* (2006.01)
(52) U.S. Cl. ....................................................... 324/251
(58) Field of Classification Search ............... 324/207.2, 324/251
See application file for complete search history.

(56) References Cited

U.S. PATENT DOCUMENTS

| 5,619,137 | A   | * | 4/1997  | Vig et al. ..................... 324/251 |
| 6,794,863 | B2  | * | 9/2004  | Hatanaka ..................... 324/251 |
| 8,058,864 | B2  | * | 11/2011 | Scheller et al. ............... 324/200 |
| 2007/0164732 | A1 |   | 7/2007  | Voisine et al. |

FOREIGN PATENT DOCUMENTS

| JP | 05-327421 A   | 12/1993 |
| JP | 2004-020289 A | 1/2004  |
| JP | 2005-260629 A | 9/2005  |

OTHER PUBLICATIONS

Extended European Search Report for European Application No. 08721960.6, dated Aug. 18, 2010, 7 pages.
International Search Report for International Application No. PCT/JP2008/054544, dated May 27, 2008, 1 page.

* cited by examiner

*Primary Examiner* — Jay Patidar
(74) *Attorney, Agent, or Firm* — Brinks Hofer Gilson & Lione

(57) ABSTRACT

A magnetic sensor circuit includes: a Hall element; a comparator circuit for comparing a Hall voltage corresponding to a magnetic flux passing through the Hall element with a threshold voltage; an output logic determination circuit for determining output logic of the magnetic sensor circuit based on an output signal from the comparator circuit; a threshold voltage control circuit for determining the threshold voltage based on a data signal output from the output logic determination circuit; and a threshold voltage output circuit for outputting the threshold voltage for the comparator circuit based on a data signal output from the threshold voltage control circuit. Therefore, the magnetic sensor circuit in which a circuit scale is small, and increase in current consumption and cost is suppressed can be provided.

7 Claims, 4 Drawing Sheets

| CONDITION | x1 | x2 | y1 | y2 | y3 | y4 |
|---|---|---|---|---|---|---|
| ① | H | H | L | H | H | L |
| ② | L | H | H | L | L | H |
| ③ | L | L | H | L | H | L |

⊗ FORWARD (N POLE) MAGNETIC FLUX
⊙ REVERSE (S POLE) MAGNETIC FLUX

MAGNETIC SENSOR CIRCUIT

TECHNICAL FIELD

The present invention relates to a magnetic sensor circuit for detecting a magnetic field.

BACKGROUND ART

With a reduction in size of a portable communication device or the like, the number of devices having a folding mechanism is on the rise. A method of detecting a state of the folding mechanism includes a method using a magnet and a magnetic sensor circuit. In the magnetic sensor circuit, when the magnetic detection element and a signal processing circuit are integrally formed on a semiconductor IC using a silicon substrate, a Hall element is generally used as the magnetic detection element. FIG. 5 illustrates the magnetic sensor circuit using the Hall element (see Patent Document 1).

The magnetic sensor circuit illustrated in FIG. 5 includes a comparator circuit 7 with a hysteresis function to which a Hall voltage having a monotonically increasing relationship with a forward magnetic flux passing through a Hall element 1 is input, and a comparator circuit 8 with a hysteresis function to which a Hall voltage having a monotonically increasing relationship with a reverse magnetic flux passing through the Hall element 1 is input, to perform the logical OR operation between the respective outputs thereof. Therefore, whether or not there is a magnet at a close position can be detected independently of a magnetic polarity of the magnet.

FIG. 6 illustrates a relationship between the magnetic flux passing through the Hall element and an output signal in the magnetic sensor circuit of FIG. 5.

Patent Document 1: JP 2005-260629 A

DISCLOSURE OF THE INVENTION

Problem to be Solved by the Invention

However, in the conventional magnetic sensor circuit, two comparator circuits with a hysteresis function which have more complex structures than a comparator circuit are used, and hence a circuit scale becomes larger, thereby increasing current consumption and cost.

The present invention has been made to solve the problem as described above, and it is therefore an object of the present invention to realize a magnetic sensor circuit in which increase in current consumption and cost is suppressed using a simple circuit.

Means for Solving the Problem

A magnetic sensor circuit according to the present invention includes: a Hall element; a comparator circuit for comparing a Hall voltage corresponding to a magnetic flux passing through the Hall element with a threshold voltage; an output logic determination circuit for determining output logic of the magnetic sensor circuit based on an output signal from the comparator circuit; a threshold voltage control circuit for determining the threshold voltage based on a data signal output from the output logic determination circuit; and a threshold voltage output circuit for outputting the threshold voltage for the comparator circuit based on a data signal output from the threshold voltage control circuit.

Effects of the Invention

With the magnetic sensor circuit according to the present invention, the magnetic sensor circuit including a single comparator circuit can be constructed without using two comparator circuits with a hysteresis function each having a complex structure. Therefore, the magnetic sensor circuit in which increase in current consumption and cost is suppressed can be provided.

BEST MODE FOR CARRYING OUT THE INVENTION (Embodiment)

Figure 1:
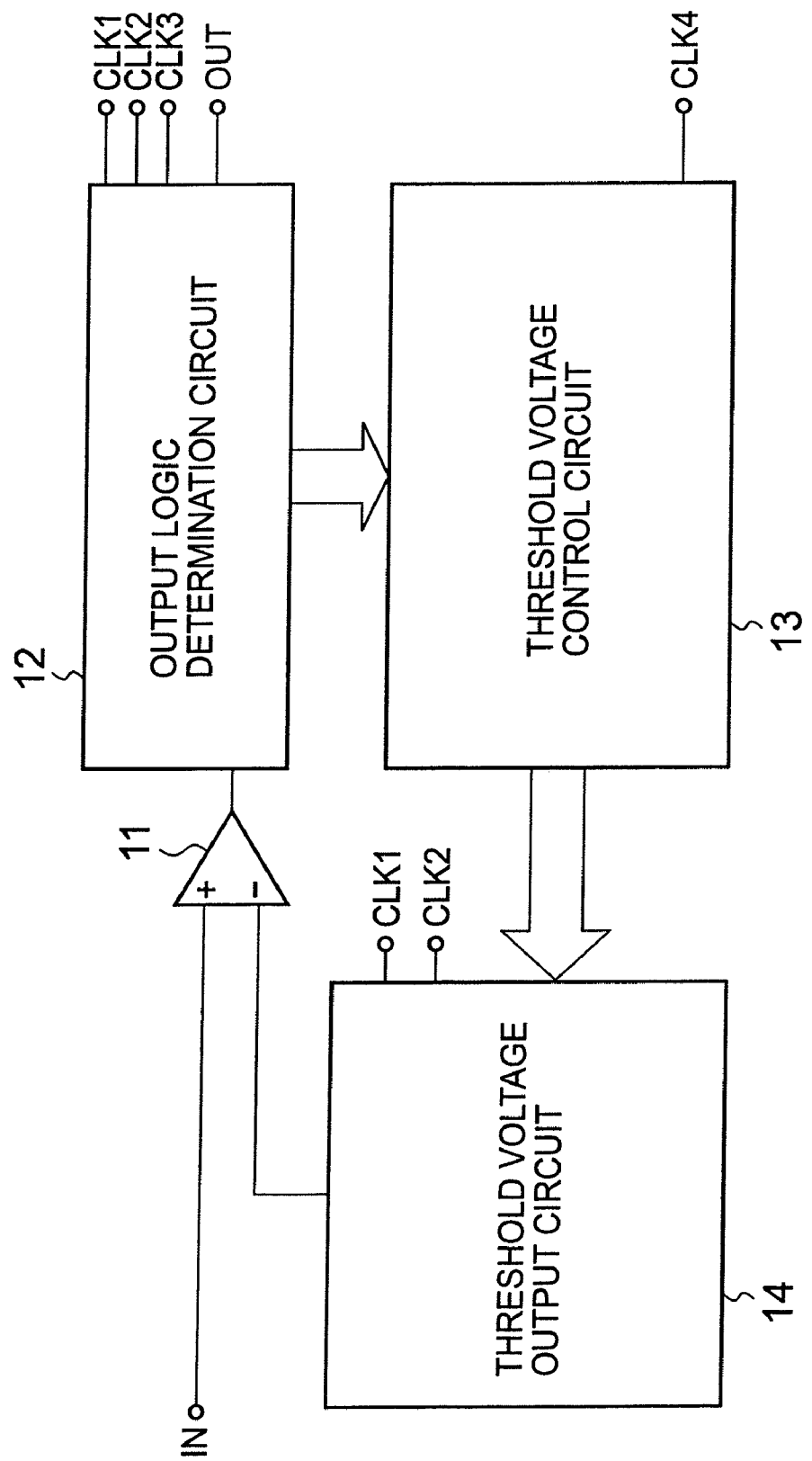
FIG. 1 is a block diagram illustrating a magnetic sensor circuit according to an embodiment of the present invention.

FIG. 1 is a circuit diagram illustrating a magnetic sensor circuit according to this embodiment.

The magnetic sensor circuit according to this embodiment includes a comparator circuit 11, an output logic determination circuit 12, a threshold voltage control circuit 13, and a threshold voltage output circuit 14.

A Hall voltage corresponding to a magnetic flux passing through a Hall element (not shown) is applied from the Hall element to an input terminal IN through an amplifier circuit (not shown). For the sake of convenience, in this embodiment, assume that the Hall voltage becomes larger as a forward (N pole) magnetic flux passing through the Hall element increases. The Hall voltage is set so as to become a predetermined value when the magnetic flux passing through the Hall element is zero. That is, an output operating point of the amplifier circuit (not shown) for amplifying the Hall voltage is set so as to become the predetermined value when the magnetic flux passing through the Hall element is zero. For the sake of convenience, in this embodiment, assume that the predetermined value is set so as to become a value equal to half of a power source voltage Vdd, that is, Vdd/2.

The comparator circuit 11 compares a voltage at the input terminal IN with a voltage output from the threshold voltage output circuit 14. The output logic determination circuit 12 outputs an output signal of the magnetic sensor circuit to an output terminal OUT of the magnetic sensor circuit based on an output signal from the comparator circuit 11 and clock signals CLK1, 2, and 3. The output logic determination circuit 12 outputs original data signals for determining threshold voltages of the threshold voltage output circuit 14. The threshold voltage control circuit 13 outputs control signals for determining the threshold voltages output from the threshold voltage output circuit 14 based on the data signals output from the output logic determination circuit 12 and a clock signal CLK4. The threshold voltage output circuit 14 outputs suitable threshold voltages to the comparator circuit 11 based on the control signals from the threshold voltage control circuit 13 and the clock signals CLK1 and 2.

Figures 3, 4:
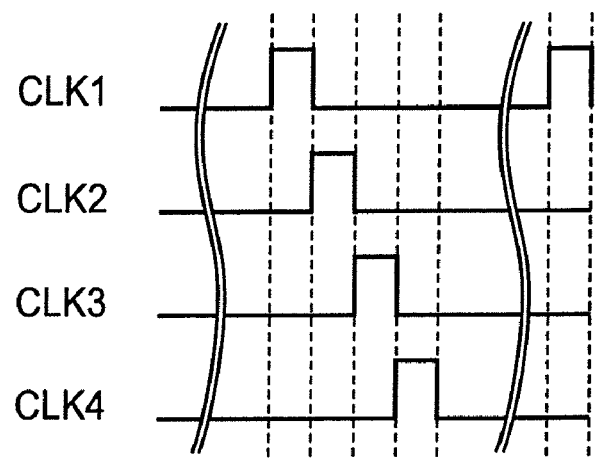
FIG. 3 is an explanatory diagram illustrating clock signals in the magnetic sensor circuit according to the embodiment of the present invention.
FIG. 4 is an explanatory diagram illustrating an operation of a threshold voltage control circuit of the magnetic sensor circuit according to the embodiment of the present invention.
Figure 5:
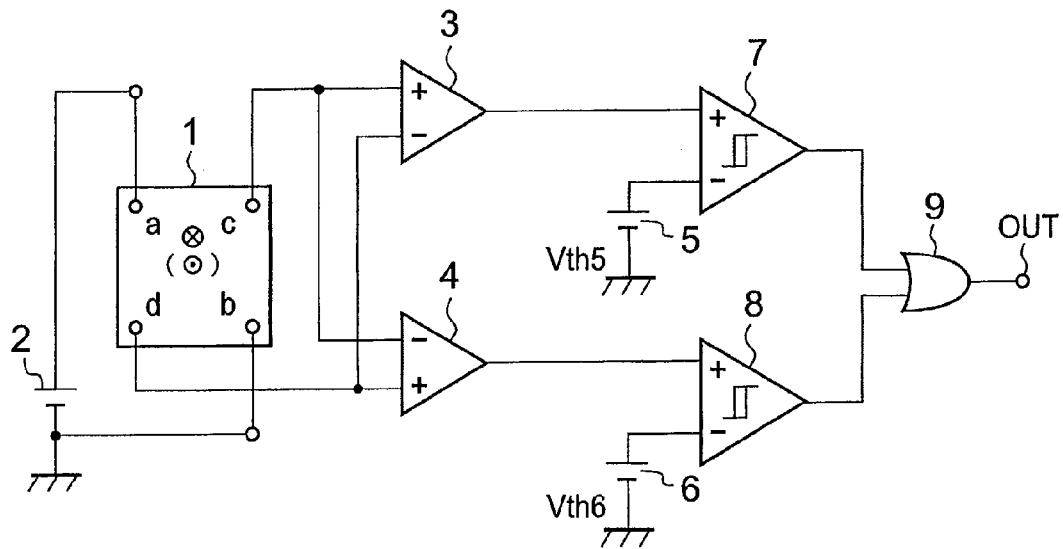
FIG. 5 is a block diagram illustrating a conventional magnetic sensor circuit.

FIG. 3 is a waveform diagram illustrating timings of the clock signals CLK1, 2, 3, and 4. Assume that the clock signals CLK1, 2, 3, and 4 are pulses which are successively repeated and do not overlap with one another. Assume that a period in which the clock signal CLK1 is H is a first period, a period in which the clock signal CLK2 is H is a second period, a period in which the clock signal CLK3 is H is a third period, and a period in which the clock signal CLK4 is H is a fourth period.

During the first period, the threshold voltage output circuit 14 outputs a first threshold voltage for the forward (N pole) magnetic flux which is higher than Vdd/2, and the output logic determination circuit 12 latches output logic of the comparator circuit 11.

During the second period, the threshold voltage output circuit 14 outputs a second threshold voltage for the reverse (S pole) magnetic flux which is lower than Vdd/2, and the output logic determination circuit 12 latches output logic of the comparator circuit 11.

During the third period, the output logic determination circuit 12 determines output logic of the magnetic sensor circuit based on the output logic of the comparator circuit 11 which is latched during the first period and the output logic of the comparator circuit 11 which is latched during the second period, and outputs the determined output logic to the output terminal OUT of the magnetic sensor circuit. For example, when the forward (N pole) or reverse (S pole) magnetic flux is strong, H is output. When the magnetic flux is weak, L is output.

During the fourth period, the threshold voltage control circuit 13 outputs, to the threshold voltage output circuit 14, control signals for determining the first threshold voltage for the next first period and the second threshold voltage for the next second period based on the data signals output from the output logic determination circuit 12.

Figure 2:
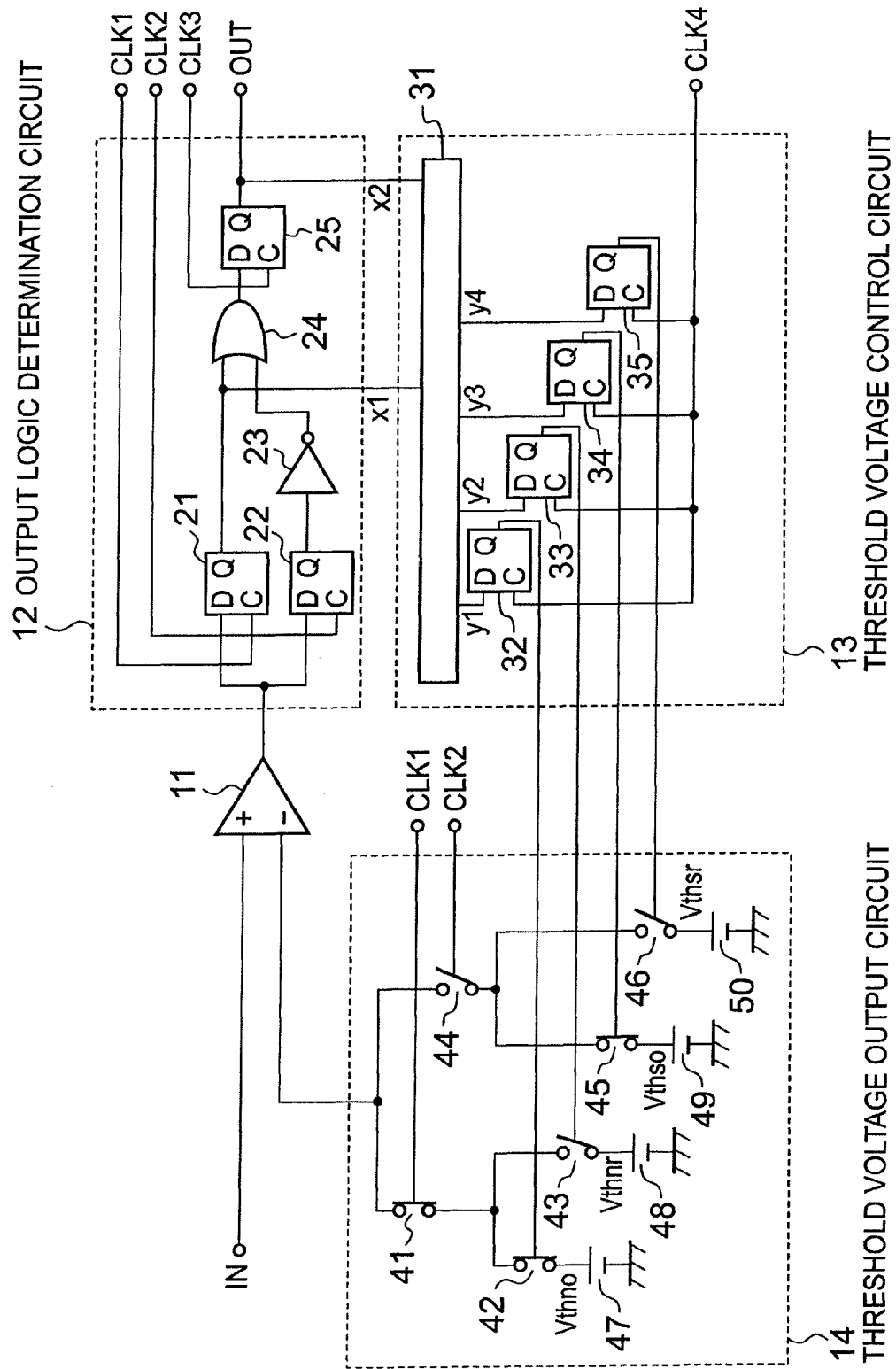
FIG. 2 is a circuit diagram illustrating the magnetic sensor circuit according to the embodiment of the present invention.

The output logic determination circuit 12, the threshold voltage control circuit 13, and the threshold voltage output circuit 14 are realized by, for example, circuits illustrated in FIG. 2.

The output logic determination circuit 12 includes: a storage circuit 21 for latching the output logic of the comparator circuit 11 during the first period; a storage circuit 22 for latching the output logic of the comparator circuit 11 during the second period; an inverter circuit 23; the inverter circuit 23 and an OR circuit 24 for determining the output logic of the magnetic sensor circuit based on the output logic of the comparator circuit 11 which is latched during the first period and the output logic of the comparator circuit 11 which is latched during the second period; and a storage circuit 25 for latching an output of the OR circuit 24 to determine the output logic of the magnetic sensor circuit.

The threshold voltage control circuit 13 includes: a logic circuit 31 for generating the data signals for determining the first threshold voltage for the next first period and the second threshold voltage for the next second period based on the data signals output from the output logic determination circuit 12; and storage circuits 32, 33, 34, and 35 for latching the data signals.

The threshold voltage output circuit 14 includes: switches 42, 43, 45, and 46 on/off-controlled (turned on, for example, when control signal is H) in response to the control signals output from the threshold voltage control circuit 13; a switch 41 on/off-controlled in response to the clock signal CLK1; a switch 44 on/off-controlled in response to the clock signal CLK2; and a voltage source 47 having a voltage value Vthno, a voltage source 48 having a voltage value Vthnr, a voltage source 49 having a voltage value Vthso, and a voltage source 50 having a voltage value Vthsr, which are selected by the switches.

The magnetic sensor circuit as described above operates as follows to have a function of detecting a magnetic flux passing through the Hall element and outputting a detection signal.

When a strong forward (N pole) magnetic flux passes through the Hall element, a voltage much higher than Vdd/2 is input to the terminal IN. The comparator circuit 11 outputs the H level during both the first period and the second period. The storage circuit 21 latches and outputs the H level during the first period. The storage circuit 22 latches and outputs the H level during the second period. The output of the OR circuit 24 becomes the H level, and hence the storage circuit 25 latches and outputs the H level during the third period. That is, when the strong forward (N pole) magnetic flux passes through the Hall element, the magnetic sensor circuit outputs the H level.

When a strong reverse (S pole) magnetic flux passes through the Hall element, a voltage much lower than Vdd/2 is input to the terminal IN. The comparator circuit 11 outputs the L level during both the first period and the second period. The storage circuit 21 latches and outputs the L level during the first period. The storage circuit 22 latches and outputs the L level during the second period. The output of the OR circuit 24 becomes the H level, and hence the storage circuit 25 latches and outputs the H level during the third period. That is, when the strong reverse (S pole) magnetic flux passes through the Hall element, the magnetic sensor circuit outputs the H level.

When the magnetic flux passing through the Hall element is weak and zero (or close to zero), a voltage equal to Vdd/2 (or close to Vdd/2) is input to the terminal IN. The comparator circuit 11 outputs the L level during the first period and outputs the H level during the second period. The storage circuit 21 latches and outputs the L level during the first period. The storage circuit 22 latches and outputs the H level during the second period. The output of the OR circuit 24 becomes the L level, and hence the storage circuit 25 latches and outputs the L level during the third period. That is, when the magnetic flux passing through the Hall element is zero, the magnetic sensor circuit output the L level.

Figure 6:
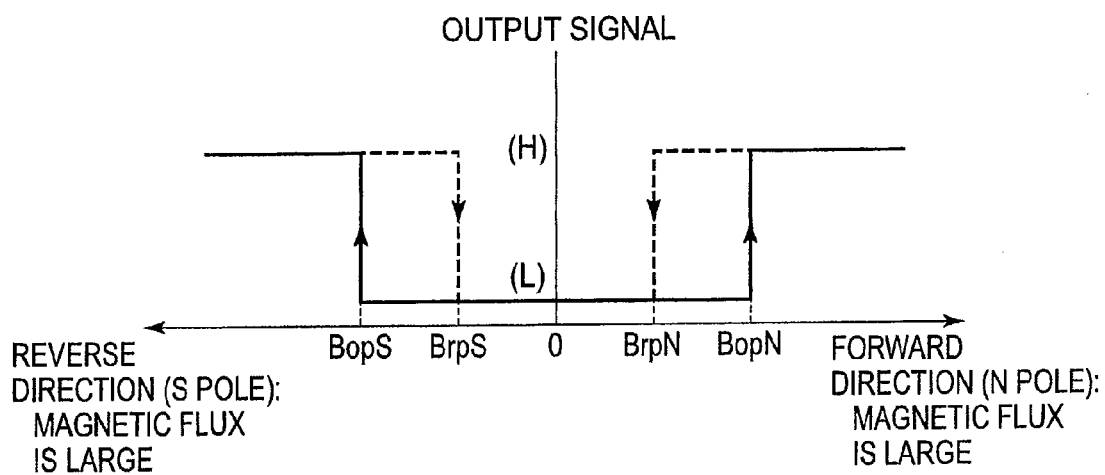
FIG. 6 is an explanatory diagram illustrating a relationship between a magnetic flux passing through a Hall element of the magnetic sensor circuit and an output signal thereof.

Next, conditions necessary for the magnetic sensor circuit to have hysteresis characteristics as illustrated in FIG. 6 are described. The necessary conditions are the following three conditions (1) to (3).

(1) When the strong forward (N pole) magnetic flux passes through the Hall element 1 and thus the H level is output to the output terminal OUT of the magnetic sensor circuit, the respective threshold voltages output from the threshold voltage output circuit 14 to the comparator circuit 11 during the next first period and the next second period are the threshold voltages corresponding to a forward (N pole) magnetic flux BrpN and a reverse (S pole) magnetic flux BopS, that is, Vthnr and Vthso.

(2) When the strong forward (S pole) magnetic flux passes through the Hall element 1 and thus the H level is output to the output terminal OUT of the magnetic sensor circuit, the respective threshold voltages output from the threshold voltage output circuit 14 to the comparator circuit 11 during the next first period and the next second period are the threshold voltages corresponding to a forward (N pole) magnetic flux BopN and a reverse (S pole) magnetic flux BrpS, that is, Vthno and Vthsr.

(3) When a weak magnetic flux passes through the Hall element 1 and thus the L level is output to the output terminal OUT of the magnetic sensor circuit, the respective threshold voltages output from the threshold voltage output circuit 14 to the comparator circuit 11 during the next first period and the next second period are the threshold voltages corresponding to a forward (N pole) magnetic flux BopN and a reverse (S pole) magnetic flux BopS, that is, Vthno and Vthso.

In order to satisfy the three conditions described above, a truth table to be realized by the logic circuit 31 of the circuit of FIG. 2 is illustrated in FIG. 4. The logic circuit 31 receives, as data signals, an output signal x1 from the storage circuit 21 and an output signal x2 from the storage circuit 25, and outputs data signals y1, y2, y3, and y4 for determining the threshold voltages of the comparator circuit 11 based on the truth table illustrated in FIG. 4.

That is, the threshold voltage control circuit 13 receives the data signals x1 and x2 output from the output logic determination circuit 12 and outputs the data signals y1, y2, y3, and y4 to the threshold voltage output circuit 14 in response to the clock signal CLK4. The threshold voltage output circuit 14 suitably turns on/off the switches 42, 43, 44, and 45 based on the data signals y1, y2, y3, and y4 to determine the threshold voltages of the comparator circuit 11. When the magnetic sensor circuit operates as described above, the magnetic sensor circuit can have the hysteresis characteristics as illustrated in FIG. 6.

The circuit diagram of the magnetic sensor circuit illustrated in FIG. 2 and the truth table of the logic circuit 31 illustrated in FIG. 4 are examples. The magnetic sensor circuit according to the present invention is not limited to the circuit and the truth table as described above. For example, each of the storage circuits 21, 22, 25, 32, 33, 34, and 35 may be replaced by a normal sample and hold circuit including a switch and a capacitor. For example, in a case where data signals different from the data signals illustrated in FIG. 2 is applied as the data signals output from the output logic determination circuit 12, a truth table corresponding to such a case is desirably set to operate the logic circuit 31.

In this embodiment, the comparator circuit 11 performs the comparison operation on the forward (N pole) magnetic flux during the first period and performs the comparison operation on the reverse (S pole) magnetic flux during the second period. In a case where the reverse operations, that is, the comparison operation on the reverse (S pole) magnetic flux during the first period and the comparison operation on the forward (N pole) magnetic flux during the second period are desired, when the structure of the output logic determination circuit 12 or the like is suitably provided, the same effect as in this embodiment is obviously obtained.

In this embodiment, it is assumed that the Hall voltage applied to the input terminal IN becomes larger as the forward (N pole) magnetic flux passing through the Hall element increases. In a case where it is assumed that the Hall voltage becomes larger as the reverse (S pole) magnetic flux passing through the Hall element increases, when the structure of the output logic determination circuit 12 or the like is suitably provided, the same effect as in this embodiment is obviously obtained.

In this embodiment, the various clock signals may be generated in the same device as the magnetic sensor circuit or generated in a device provided outside the magnetic sensor circuit, and thus the generation thereof is not limited.

In this embodiment, for example, a power source voltage from each of the various voltage sources may be obtained by dividing by a plurality of resistors or other generation methods may be used, and thus the generation thereof is not limited.

As described above, according to the magnetic sensor circuit in the present invention, a magnetic sensor circuit can be realized with the aid of a logic circuit and switches without using the comparator circuit with hysteresis function having the complex structure. Therefore, a circuit scale can be reduced smaller than that of a conventional magnetic sensor circuit. Problems such as increases in current consumption and cost can be solved.

Industrial Applicability

The magnetic sensor circuit including the Hall element can be used to detect a state of a folding mechanism. Therefore, the present invention can also be applied to the use of a portable communication device having the folding mechanism, such as a cellular phone.

The invention claimed is:

1. A magnetic sensor circuit for detecting a magnetic field, comprising:
a Hall element;
a comparator circuit for comparing a Hall voltage corresponding to a magnetic flux passing through the Hall element with a threshold voltage;
an output logic determination circuit for determining output logic of the magnetic sensor circuit based on an output signal from the comparator circuit;
a threshold voltage control circuit for determining the threshold voltage based on a signal output from the output logic determination circuit; and
a threshold voltage output circuit for outputting a switched threshold voltage to the comparator circuit based on a signal output from the threshold voltage control circuit,
wherein the threshold voltage output circuit switches the threshold voltage in response to a clock signal, and
wherein the output logic determination circuit judges a magnetic field strength based on an output of the comparator circuit in synchronization with the clock signal, to have a hysteresis.

2. A magnetic sensor circuit according to claim 1, wherein the output logic determination circuit comprises:
a first storage circuit for storing a result obtained by judging a magnetic field strength in a first direction in response to a first clock signal;
a second storage circuit for storing a result obtained by judging a magnetic field strength in a second direction in response to a second clock signal; and
a third storage circuit for storing, in response to a third clock signal, the output logic of the magnetic sensor circuit which is determined based on the result obtained by judging the magnetic field strength in the first direction and the result obtained by judging the magnetic field strength in the second direction, which are stored in the first storage circuit and the second storage circuit.

3. A magnetic sensor circuit according to claim 2, wherein the output logic determination circuit outputs a signal from the first storage circuit or the second storage circuit and a signal from the third storage circuit to the threshold voltage control circuit.

4. A magnetic sensor circuit according to claim 3, wherein the threshold voltage control circuit:
determines the threshold voltage based on the signal from the first storage circuit or the second storage circuit and the signal from the third storage circuit; and
outputs the determined threshold voltage to the threshold voltage output circuit in response to a fourth clock signal.

5. A magnetic sensor circuit according to claim 1, wherein the threshold voltage output circuit:

outputs a threshold voltage for a magnetic field in a first direction to the comparator circuit in response to a first clock signal; and outputs a threshold voltage for a magnetic field in a second direction to the comparator circuit in response to a second clock signal.

6. A magnetic sensor circuit according to claim 1, wherein the Hall voltage corresponding to the magnetic flux passing through the Hall element is a voltage equal to half of a power source voltage when the magnetic flux passing through the Hall element is zero.

7. A magnetic sensor circuit according to claim 1, wherein the threshold voltage is generated by dividing a power supply voltage by a plurality of resistors.

* * * * *